(12) United States Patent
Ren et al.

(10) Patent No.: US 8,560,294 B1
(45) Date of Patent: Oct. 15, 2013

(54) METHOD AND APPARATUS FOR AN AUTOMATED INPUT/OUTPUT BUFFER INFORMATION SPECIFICATION MODEL GENERATOR

(75) Inventors: GuoJun Ren, San Jose, CA (US); Prasad Rau, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 1257 days.

(21) Appl. No.: 12/034,368

(22) Filed: Feb. 20, 2008

(51) Int. Cl.
  *G06F 17/50* (2006.01)
  *G06F 9/44* (2006.01)
  *G06F 13/10* (2006.01)
  *G06F 13/12* (2006.01)
  *G06F 9/455* (2006.01)
  *G06F 11/22* (2006.01)

(52) U.S. Cl.
  USPC .............. 703/14; 703/16; 703/21; 716/114; 716/132; 716/136

(58) Field of Classification Search
  USPC .............. 703/21, 14, 16; 716/114, 132, 136
  See application file for complete search history.

(56) References Cited

U.S. PATENT DOCUMENTS

| | | | |
|---|---|---|---|
| 6,218,858 B1 * | 4/2001 | Menon et al. | 326/39 |
| 6,292,766 B1 * | 9/2001 | Mattos et al. | 703/14 |
| 2003/0005393 A1 * | 1/2003 | Kawamoto | 716/3 |
| 2007/0185699 A1 * | 8/2007 | Suwa et al. | 703/13 |
| 2007/0250800 A1 * | 10/2007 | Keswick | 716/8 |
| 2008/0059142 A1 * | 3/2008 | Chlipala et al. | 703/14 |

OTHER PUBLICATIONS

Michael Mirmake, "IBIS Open Forum I/O Buffer Modeling Cookbook", Version 4.0, Revison 0.95, 2005.*
Nandakumar G. N., "Application of Douglas-Peuker Algorithm to Generate Compact but Accurate IBIS Models", Proceedings of the 18$^{th}$ International Conference on VLSI Design, IEEE, 2005.*
Ambrish Kant Varma, "Improved Behavioral Modeling Based on the Input Output Buffer Information Specification", A dissertation submitted to the Graduate Faculty of North Carolina State University, Jan. 2007.*

* cited by examiner

*Primary Examiner* — Omar Fernandez Rivas
*Assistant Examiner* — Angel Calle
(74) *Attorney, Agent, or Firm* — Michael T. Wallace; LeRoy D. Maunu

(57) ABSTRACT

A method for automating input/output buffer information specification (IBIS) model generation. A wrapper utility combines components into an automated generation flow to model multiple input/output (I/O) buffers that conform to single-ended and differential I/O standards. Configuration data files are imported to properly configure the modeled I/O buffers according to a specific set of signal parameters across all process corners. Output and input termination impedance may also be modeled within the I/O buffer. A simulation setup file of the modeled I/O buffer is generated to determine the voltage/current (V/I) and voltage/time (V/T) data for the modeled I/O buffer for each process corner. A raw IBIS model is then created, formatted, and validated to determine the accuracy of the IBIS model. Execution steps of the IBIS model generator are then iterated to automatically generate, correlate, and compile IBIS models for each I/O standard into a single file.

20 Claims, 8 Drawing Sheets

METHOD AND APPARATUS FOR AN AUTOMATED INPUT/OUTPUT BUFFER INFORMATION SPECIFICATION MODEL GENERATOR

FIELD OF THE INVENTION

The present invention generally relates to input/output buffer simulation models, and more particularly to an automated input/output buffer information specification model generator.

BACKGROUND OF THE INVENTION

The input/output buffer information specification (IBIS) was developed by Intel® Corporation in the early 1990s as a behavioral model that describes the electrical characteristics of the digital inputs and outputs of a device. Rather than using schematic symbols or polynomial expressions, an IBIS model instead consists of tabular data that contains current and voltage values for the input pins of the device, as well as the voltage/time relationships that exist at the output pins of the device under rising and/or falling switching conditions.

Since IBIS models describe the behavioral aspects of the inputs and outputs of a device through voltage/current (V/I) and voltage/time (V/T) data, disclosure of proprietary information, such as semiconductor process and circuit information, need not be disclosed within the IBIS models. As such, semiconductor vendors are no longer reluctant to release behavioral information about their devices, since the proprietary aspects of the devices may remain confidential, while the behavioral aspects of those devices may be released in support of the simulation platforms that are used to characterize performance of those devices.

Many electronic design automation (EDA) vendors support the IBIS specification due in large part to the accuracy of the IBIS model. In particular, non-linear aspects of the input/output (I/O) structures, the electrostatic discharge (ESD) structures, and the device package parasitics may all be represented within a typical IBIS model. IBIS also provides several advantages over traditional simulation models, such as HSPICE, since IBIS based simulations typically execute much faster than HSPICE based simulations. In addition, IBIS based models may be executed on industry-wide platforms since most EDA vendors support the IBIS specification.

IBIS models facilitate testing of I/O interfaces, verification at the board level, such as signal integrity and system level timing, and interoperation at the system level. Data used to generate the IBIS models may either be gathered from simulated circuit measurements, such as may be obtained using HSPICE, or gathered from bench measurements conducted on actual semiconductor devices. If a simulation is used, the V/I and V/T data for each of the I/O buffers may be generated by an HSPICE-to-IBIS (S2I) conversion program for each process corner, e.g., typical, weak (slow), and strong (fast), which are defined with respect to process, temperature, and supply variations. Once the V/I and V/T data for each of the I/O buffers is generated, the S2I conversion program also generates the raw IBIS model.

As I/O standards proliferate, however, so does the number of models that are needed to simulate them. For example, the I/O interface of a typical field programmable gate array (FPGA) may be configured to support several hundred I/O standards. Thus, in order to characterize the FPGA's performance over each I/O standard, one IBIS model must be created for each I/O standard. In addition, a correlation report must be generated to determine the accuracy of the IBIS model as compared to the transistor netlist counterpart that may be utilized during an HSPICE simulation. Thus, conventional techniques that may be used to generate IBIS models become cumbersome when tasked with producing IBIS models for multiple I/O standards.

Efforts continue, therefore, to automate IBIS model generation and correlation so as to expedite the modeling and simulation of multiple I/O standards.

SUMMARY OF THE INVENTION

To overcome limitations in the prior art, and to overcome other limitations that will become apparent upon reading and understanding the present specification, various embodiments of the present invention disclose a method for an automated input/output buffer information specification model generator.

In accordance with one embodiment of the invention, a method of automating input/output buffer information specification model generation comprises importing configuration data files into an input/output buffer information specification model generator, selecting data from one or more of the configuration data files to model a plurality of buffers, generating a simulation setup file for each of the plurality of modeled buffers, measuring a set of parameters for each simulation setup file generated, and generating an input/output buffer information specification model for each set of parameters measured.

In accordance with another embodiment of the invention, an input/output buffer information specification modeling system comprises a processor that is adapted to generate a plurality of input/output buffer information specification models. The processor is further adapted to perform functions that include importing configuration data files, selecting data from one or more of the configuration data files to model a plurality of buffers, generating a simulation setup file for each of the plurality of modeled buffers, measuring a set of parameters for each simulation setup file generated, generating an input/output buffer information specification model for each set of parameters measured, and combining each of the input/output buffer information specification models into a single executable file.

In accordance with another embodiment of the invention, a method of combining a plurality of input/output buffer information specification models into a file comprises iterating an execution loop to select a plurality of input/output standards, determining a hardware target for implementation of each of the plurality of input/output standards selected, generating a simulation setup file for each of the determined hardware targets, generating an input/output buffer information specification model for each simulation setup file generated, and storing each generated input/output buffer information specification model into the file.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
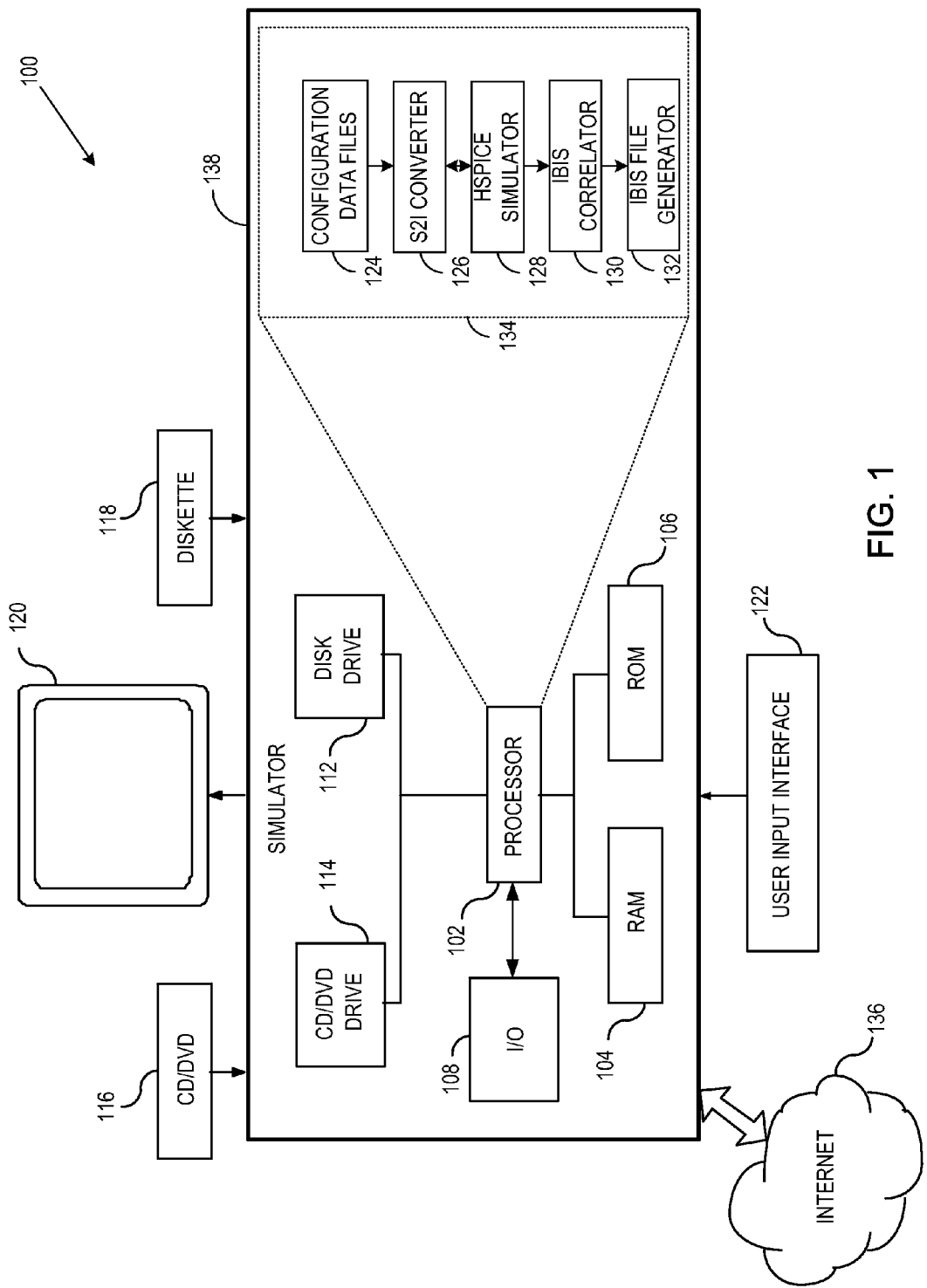
FIG. 1 illustrates an exemplary simulation workstation.

Generally, various embodiments of the present invention are applied to the modeling and simulation of one or more input/output (I/O) buffers within an electronic system. For instance, a method for an automated input/output buffer information specification (IBIS) model generator is provided, which generates a plurality of IBIS models that may then be used by a simulation platform that is capable of utilizing IBIS models during simulation runs. The generated IBIS models correspond to the plurality of I/O standards that may be supported by the I/O buffers contained within the integrated circuits (ICs) of the electronic system. A correlation report may also be generated, which may be used to verify that the simulation results that are obtained using IBIS models exhibit an acceptable error deviation from simulation results using other simulation models, such as the simulation setup files used by HSPICE.

The automated IBIS model generator may exist as a wrapper utility that combines each component required by the IBIS model generator into an automated generation flow. The wrapper utility begins execution with a determination as to which I/O standard is to be modeled. For example, a single-ended I/O standard for a standard transistor-transistor logic (TTL) or complementary metal oxide semiconductor (CMOS) I/O buffer stage may be required. Conversely, an IBIS model for a differential I/O standard, such as low-voltage differential signaling (LVDS) may be required.

Next, the hardware target must be determined. Given that a programmable logic device (PLD) may be the hardware target that is to be modeled, a plurality of configuration data files must be imported by the automated IBIS model generator so as to properly configure the modeled I/O buffers within the PLD for a given I/O standard simulation. A field programmable gate array (FPGA), for example, is representative of a PLD that contains configurable I/O drivers and receivers that may support hundreds of I/O standards. Each I/O standard defines a specific set of signal parameters, such as output drive voltage magnitude, slew-rate, and output drive strength, i.e., output drive current magnitude. Thus, the various configuration data files determine the configuration for each I/O buffer being modeled, so that the I/O buffers exhibit the correct operational parameters for a given I/O standard.

In addition, the various configuration data files may also define configurations for each I/O buffer that allow IBIS models to be generated for each process corner. For example, each I/O buffer may be configured by the configuration data files to operate with a nominal supply voltage magnitude, a nominal temperature, and normal process parameters, such that an IBIS model exhibiting typical corner conditions may be generated. Alternately, each I/O buffer may instead be generated by the configuration data files to operate with a minimum supply voltage magnitude, a maximum temperature, and weak process parameters, such that an IBIS model exhibiting minimum corner conditions may be generated. An IBIS model that exhibits maximum corner conditions, on the other hand, may be generated by the configuration data files by configuring each I/O buffer to operate with a maximum supply voltage magnitude, minimum temperature, and strong process parameters.

The simulated I/O drivers and receivers of an FPGA may also require proper output and input termination impedance depending upon the I/O standard being modeled. Some I/O standards, for example, require external termination resistors. For other I/O standards, however, on-die termination impedance may be used. As such, an additional configuration data file may, therefore, be imported by the automated IBIS model generator, so as to properly define the on-die output and input termination impedance. In one embodiment, the output and input termination impedance may be controlled by a digitally controlled impedance (DCI) block, whose configuration may be determined by a DCI configuration data file imported by the automated IBIS model generator.

Once configuration data from some or all of the configuration data files that define the I/O buffer for a particular simulated I/O standard have been imported by the automated IBIS model generator, an HSPICE simulation setup file of the I/O buffer is generated that corresponds to the relevant configuration data files. Next, an HSPICE-to-IBIS (S2I) conversion program may execute an HSPICE simulation based upon the HSPICE simulation setup file that may determine the voltage/current (V/I) and voltage/time (V/T) data for the modeled I/O buffer for each process corner. Once the V/I and V/T data for the I/O buffer is collected, the S2I conversion program may also generates the raw IBIS model. S2I conversion freeware programs are readily available from the Electronic Research Lab at North Carolina State University, which includes the latest S2I conversion utility, s2ibis3 V1.1, which is a Java based utility released on Mar. 27, 2006.

The raw IBIS model generated by the s2ibis3 utility is an ASCII formatted text file, which may then be post-processed by a syntax validation routine that inspects and modifies the structure of the IBIS model so that the IBIS model follows the format as specified by the IBIS standard. Once post-processing of the raw IBIS model is complete, an HSPICE simulation is executed by using the post-processed IBIS model as an input to the HSPICE simulation. The accuracy of the HSPICE simulation using the IBIS model is then validated by correlating the IBIS model simulation data with data generated by the HSPICE simulation using the HSPICE simulation setup file. The various execution steps of the automated IBIS model generator may then be iterated within an execution loop, so as to generate and correlate IBIS models for each I/O standard that is supported by the I/O buffers within the FPGA. The validated IBIS models may then be combined into a single file for use by an IBIS compatible simulation platform.

Turning to FIG. 1, an IBIS compatible simulation platform is illustrated, which may be used to implement the automated IBIS model generator in accordance with one embodiment of the invention. The exemplary simulation platform includes simulator 138, which includes a processor 102 that is coupled to random access memory (RAM) 104 and read-only memory (ROM) 106. The ROM 106 may also include other types of storage media, such as programmable ROM (PROM), electronically erasable PROM (EEPROM), etc., to store executable programs and utilities. The processor 102 may also communicate with other internal and external components through input/output (I/O) circuitry 108.

Simulator 138 may also include one or more data storage devices, including hard and floppy disk drives 112, CD/DVD drives 114, and other hardware capable of reading and/or storing information. Software for facilitating the automated IBIS model generator may be stored and distributed on a CD/DVD 116, diskette 118 or other forms of media capable of portably storing information. These storage media may be inserted into, and read by, devices such as CD/DVD drive 114, disk drive 112, etc.

The software for facilitating the automated IBIS model generator may also be transmitted to simulator 138 via data signals that are downloaded electronically via a network such as Internet 136. Simulator 138 may be coupled to a display 120, which may be any type of known display or presentation screen, such as LCD displays, plasma display, cathode ray tubes (CRT), etc. A user input interface 122 is provided, which may include one or more user interface mechanisms such as a mouse, keyboard, microphone, touch pad, touch screen, voice-recognition system, etc.

Processor 102 may be adapted to iteratively execute modeling/simulation tools 134 to aid in IBIS model generation/simulation operations. Configuration data files 124, for example, may be generated by processor 102 to define the configuration data of the I/O buffers that are to be modeled. S2I converter 126 may be coupled to receive the configuration data files 124. The S2I convertor may first generate an HSPICE simulation setup file for the modeled I/O buffer and then interoperate with HSPICE simulator 128 to generate the V/I and V/T values of the modeled I/O buffer that are based upon the HSPICE simulation setup file. S2I converter 126 then generates the raw IBIS model that is associated with the particular I/O buffer that is to be modeled.

HSPICE simulator 128 then may perform two simulations: a first simulation using the HSPICE simulation setup file; and a second simulation using the IBIS model. IBIS correlator 130 may be utilized to compare the results of the two simulations to verify that the simulation results using the IBIS model are within an acceptable deviation error percentage of the simulation results using the HSPICE simulation setup file. As each of the validated and correlated IBIS models emerge from IBIS correlator 130, IBIS file generator 132 may compile each IBIS model into a single file that may later be used by IBIS compatible simulators, such as the simulation platform of FIG. 1, during an IBIS modeled simulation run.

Figure 2:
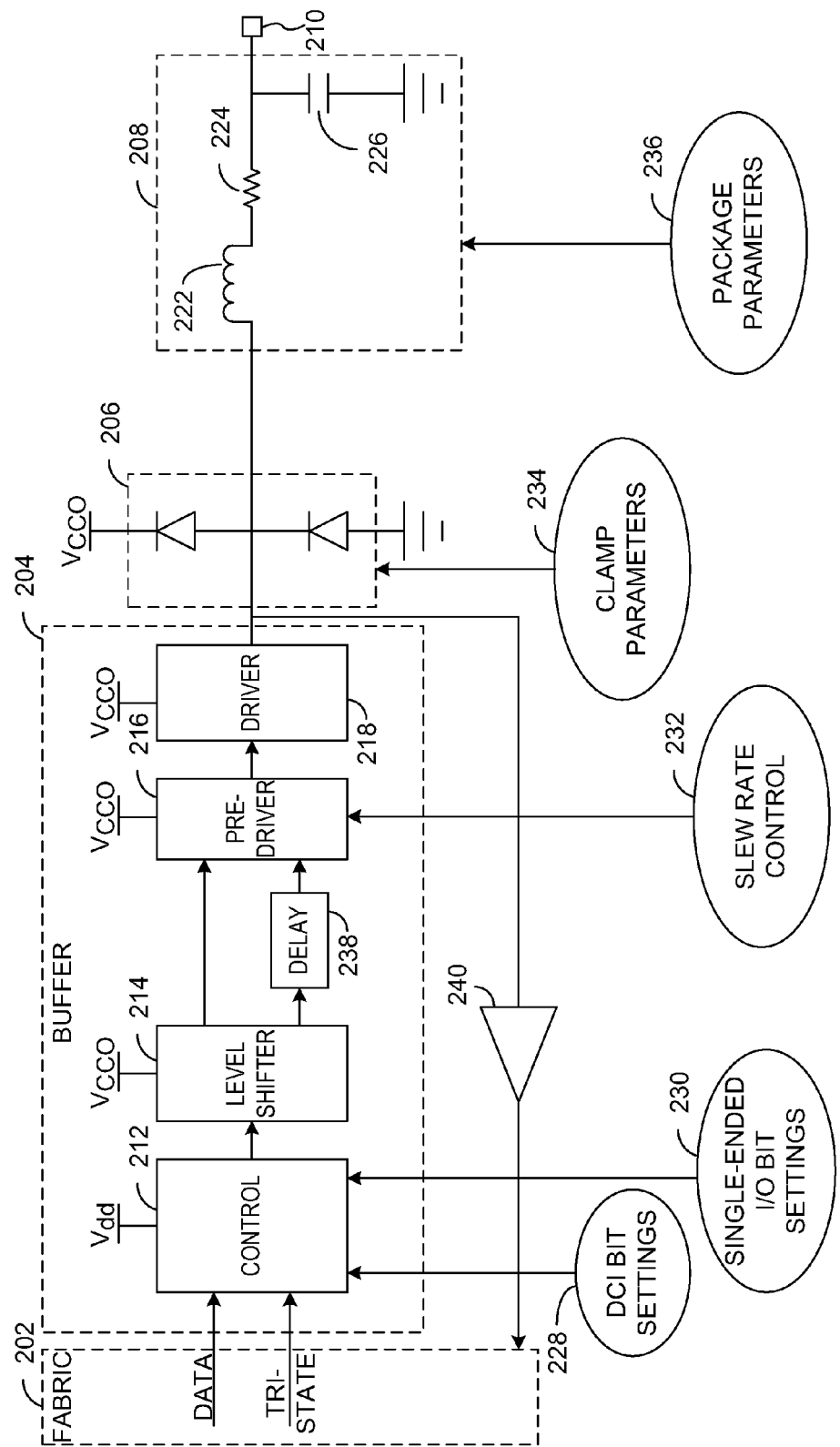
FIG. 2 illustrates a schematic diagram of each component contained within an input/output buffer information specification (IBIS) model in accordance with one embodiment of the present invention.

Turning to FIG. 2, a schematic diagram including components of an IBIS modeled I/O buffer is illustrated, as well as package information relating to the IC within which the I/O buffer resides. The package information may not be a part of the IBIS model generation process and may be added as global parameters after each IBIS model has been generated. Data and control inputs may be modeled as being provided within the IC, as well as from external configuration data files. For instance, the schematic diagram of FIG. 2 illustrates components of an integrated circuit, e.g., FPGA, based I/O buffer that may be configured to support single-ended I/O standards, such as low-voltage complementary metal oxide semiconductor (LVCMOS), low-voltage transistor-transistor logic (LVTTL), high-speed transceiver logic (HSTL), stub-series terminated logic (SSTL), gunning transceiver logic (GTL), and peripheral component interface (PCI). As discussed in more detail below, variations of each single-ended I/O standard may be configured using digitally controlled impedance (DCI) bit settings 228, single-ended I/O bit settings 230, and slew rate control 232, all of which are provided by configuration data files 124 of FIG. 1. The output signal parameters that may be modeled at output pad 210 using configuration data files 124 that may include voltage out high ($V_{OH}$), voltage out low ($V_{OL}$), duty cycle, rise time, and fall time.

Configuration data files 124 may also include clamp parameters 234 that may be utilized by the automated IBIS model generator to generate V/I tables based upon the operation of modeled clamping diodes 206 when the output of output buffer 204 is characterized in a high-impedance state, i.e., when input buffer 240 is modeled as being operational. Global package parameters 236, which as discussed above may not be included within configuration data files 124, may be used to model package 208, which represents the pad and package parasitics that may be applied to input buffer 240 and output buffer 204. For instance, inductor 222, resistor 224, and capacitor 226 may be used to model the inductance, resistance, and capacitance, respectively, of the bond wire/solder ball and pin combination of package 208.

The I/O buffer of FIG. 2 is representative of an I/O buffer that may exist within an IC, e.g., FPGA, that is to be modeled by the automated IBIS model generator. For example, FPGA fabric 202 may be modeled to generate signal TRI-STATE, so as to enable, or disable, output buffer 204. Similarly, FPGA fabric 202 may be modeled to provide signal DATA to output buffer 204 given that output buffer 204 may be enabled by signal TRI-STATE. It should be noted that while the I/O buffer of FIG. 2 is modeled as providing output buffer 204 to transmit signal DATA from fabric 202 to output pad 210, input buffer 240 may be similarly modeled, which operates to receive a signal from input pad 210 and in response, provides the received data signal to fabric 202.

Configuration data files 124 may also model control block 212 as a block that operates at core voltage, e.g., $V_{dd}$, which is the same operational voltage magnitude that is utilized by fabric block 202. Since pre-driver 216 and driver 218 may be modeled to operate at a relatively higher voltage magnitude, e.g., $V_{CCO}$, configuration data files may also model level shifter block 214, which translates data and delayed data operating at the core voltage magnitude, e.g., $V_{dd}$, to data and delayed data operating at the I/O voltage magnitude, e.g., $V_{CCO}$.

Figure 3:
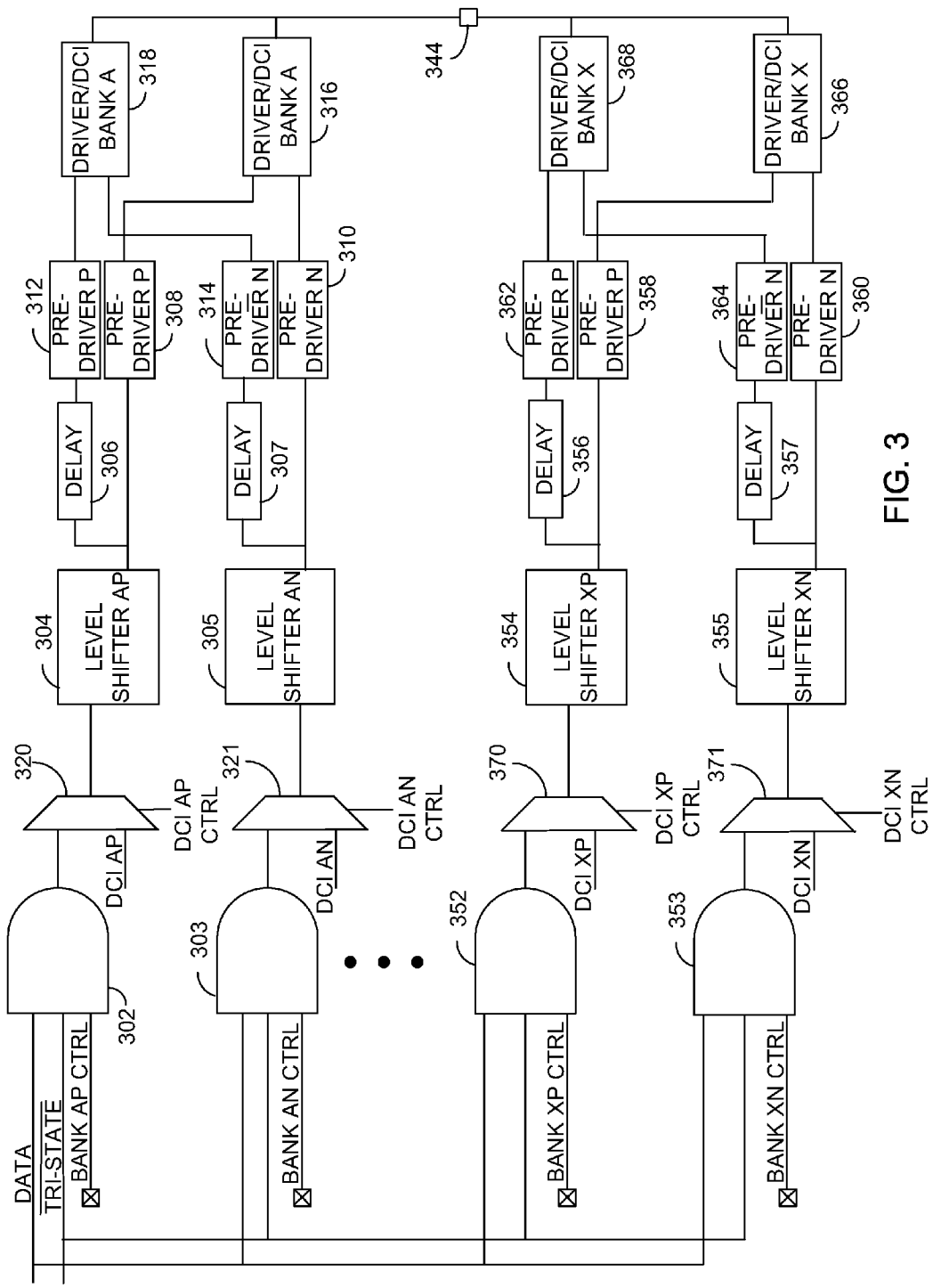
FIG. 3 illustrates detailed aspects of the buffer of the IBIS model of FIG. 2 in accordance with one embodiment of the present invention.

Turning to FIG. 3, detailed aspects of modeled output buffer 204 are illustrated. Modeled output buffer 204 consists of a plurality of data paths A-X, where only two of the data paths, e.g., A and X, are illustrated for clarity. As discussed in more detail below, any number of data paths may exist within modeled output buffer 204 as may be required for a particular IBIS model. AND gates 302/303, 352/353 and multiplexers 320/321, 370/371 illustrate one embodiment of controller 212, which as discussed in more detail below, operates to: disable the data path via signal TRI-STATE; control the drive level of the data path via signal BANK CTRL; and control the impedance of the data path via signals DCI and DCI CTRL. Signals TRI-STATE, BANK CTRL, DCI, and DCI CTRL are provided for each data channel by single-ended I/O bit settings 230 and DCI bit settings 228 of configuration data files 124.

Pre-drivers 308 and 310 provide the inputs to driver bank 316 for non-delayed data path A. Similarly, pre-drivers 358 and 360 provide the inputs to driver bank 366 for non-delayed data path X. Driver banks 318 and 368 similarly receive the outputs of pre-drivers 312/314 and 362/364 for the delayed A and X data paths, respectively. The outputs of driver banks 316-318 and 366-368 are connected to output pad 344.

In operation, configuration data files 124 of FIG. 1 are utilized by S2I converter 126 of FIG. 1 to configure the HSPICE simulation setup file of output buffer 204 so that the desired I/O standard may be modeled. For instance, any number of data paths A through X may be modeled within output buffer 204, in response to single-ended I/O bit settings 230, so as to generate the required drive current, i.e., $I_{OH}$ (current output high) and $I_{OL}$ (current output low), at output pad 344 as may be required by the particular I/O standard that is being modeled. In addition, if the I/O standard requires on-die impedance terminations, then the impedance level at output pad 344 may also be modeled in response to DCI bit settings 228. That is to say, in other words, that any one or more of data paths A through X may be modeled with configurable drivers to set the required drive current, i.e., $I_{OH}$ and $I_{OL}$, at output pad 344, while the remaining data paths A through X may be optionally modeled as configurable impedance blocks to set the correct impedance at output pad 344.

Given that no DCI control is desired, for example, then one or more of the driver banks may be enabled to provide the appropriate amount of drive current to output pad 344. In such an instance, each multiplexer within each data path A through X may be modeled as selecting their first inputs as their respective outputs. In addition, signal TRI-STATE may be deasserted, so as to allow one or more of signals BANK A CTRL through BANK X CTRL to activate one or more of their respective driver banks via the respective control blocks.

In one embodiment, for example, driver bank 316 may be modeled as a bank of push-pull transistor pairs that provides the maximum amount of $I_{OH}$ and $I_{OL}$ at output pad 344 for non-delayed data path A, while driver bank 318 may be modeled as a bank of push-pull transistor pairs that provides the maximum amount of $I_{OH}$ and $I_{OL}$ at output pad 344 for delayed data path A. Similarly, driver bank 366 may be modeled as a bank of push-pull transistor pairs that provides the minimum amount of $I_{OH}$ and $I_{OL}$ at output pad 344 for non-delayed data path X, while driver bank 368 may be modeled as a bank of push-pull transistor pairs that provides the minimum amount of $I_{OH}$ and $I_{OL}$ at output pad 344 for delayed data path X. Other data paths (not shown in FIG. 3 for simplicity) may also be modeled within output buffer 204, where each data path may contribute varying magnitudes of $I_{OH}$ and $I_{OL}$ at output pad 344, so that a programmable amount of $I_{OH}$ and $I_{OL}$ may be modeled at output pad 344 depending upon the number of data paths that are enabled by configuration files 124 and S2I converter 126 via AND gates 302/303, 352/353, and multiplexers 320/321, 370/371.

Given that DCI control is desired, on the other hand, one or more driver banks may be enabled to provide the appropriate amount of driver current at output pad 344, while one or more of the remaining driver banks may be utilized to provide the appropriate impedance magnitude at output pad 344. In such an instance, one or more of multiplexers 320/321 and 370/371 may be modeled as selecting their first inputs as the respective outputs of multiplexers 320/321 and 370/371. In addition, signal TRI-STATE may be deasserted, so as to allow one or more of corresponding signals BANK A CTRL through BANK X CTRL to activate one or more of their respective driver banks via the respective control blocks. One or more of the remaining data paths may then be selected by one or more of multiplexers 320/321 and 370/371 as a digitally controlled impedance path to select the correct magnitude of impedance at output pad 344.

For example, driver bank 316 may be modeled as a bank of push-pull transistor pairs that provides the correct amount of $I_{OH}$ and $I_{OL}$ at output pad 344 for non-delayed data path A, while driver bank 318 may be modeled as a bank of push-pull transistor pairs that provides the correct amount of $I_{OH}$ and $I_{OL}$ at output pad 344 for delayed data path A. Driver bank 366, on the other hand, may be modeled as a bank of push-pull transistor pairs whose resistance in the conductive state applies the appropriate amount of impedance at output pad 344 for non-delayed data path X, while driver bank 368 may be modeled as a bank of push-pull transistor pairs whose resistance in the conductive state applies the appropriate amount of impedance at output pad 344 for delayed data path X. Other data paths of an I/O buffer (not shown in FIG. 3 for simplicity) may be similarly modeled within output buffer 204, so that a programmable magnitude of impedance may be modeled at output pad 344 depending upon the number of data paths that are enabled for digitally controlled impedance control by configuration files 124 and S2I converter 126 via multiplexers 320/321 and 370/371.

Figure 4:
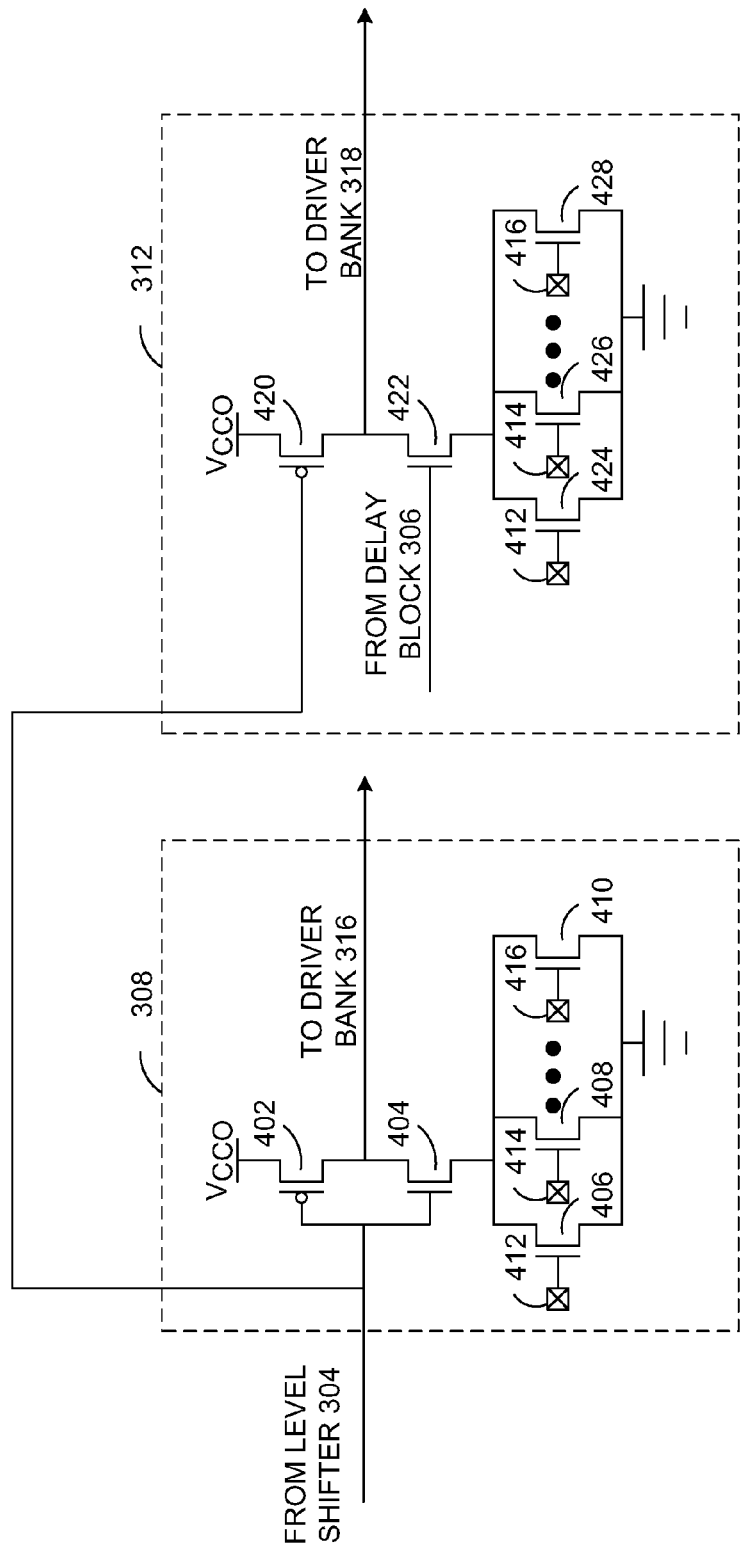
FIG. 4 illustrates schematic diagrams of modeled pre-drivers contained within the buffer of FIG. 3 in accordance with various embodiments of the present invention.

Turning to FIG. 4, schematic diagrams of modeled pre-driver P 308 and pre-driver P 312 for data path A of FIG. 3 are illustrated. It is understood that pre-driver P 358 and pre-driver P 362 for data path X, as well as the pre-driver Ps (not shown) for the other data paths of FIG. 3, may be identical to pre-driver P 308 and pre-driver P 312 as illustrated in FIG. 4. In operation, pre-driver P 308 and pre-driver P 312 may be modeled as inverters, whereby p-type metal oxide (PMOS) transistors 402,420 and n-type metal oxide (NMOS) transistors 404,422 are coupled as shown to provide inverting operations.

Logic values for control lines 412-416 are received from slew rate control 232 of FIG. 2. Thus, one or more of NMOS transistors 406-410 and 424-428 may be made conductive depending upon the logic values of control lines 412-416. In one embodiment, the geometries of transistors 406-410 may vary, such that the magnitude of source-drain current, $I_{DS}$, provided by transistor 406 is twice the magnitude of $I_{DS}$ provided by transistor 408. Similarly, the magnitude of $I_{DS}$ provided by transistor 408 is twice the magnitude of $I_{DS}$ provided by transistor 410. As such, the magnitude of current conducted through transistor 404 may be programmed in a binary fashion through appropriate selection of the conductive states of transistors 406-410. The geometries of transistors 424-428 are similarly weighted, so that the magnitude of current conducted through transistor 422 may be similarly programmed in a binary fashion. Accordingly, the slew rate of the outputs of pre-drivers 308 and 312 may be programmably modeled.

If a slow slew-rate is required by the modeled I/O standard, for example, then perhaps only a single transistor, e.g., transistors 410 and 428, may be rendered conductive by values of control lines 412-416 as provided by slew rate control 232. In such an instance, the time required to slew the output of pre-driver P 308 and pre-driver P 312, respectively, from a logic high value to a logic low value may be maximized. If a fast slew-rate is required by the modeled I/O standard, on the other hand, then perhaps all transistors, e.g., transistors 406-410 and 424-428, may be rendered conductive by values of control lines 412-416 as provided by slew rate control 232. In such an instance, the time required to slew the output of pre-driver P 308 and pre-driver P 312, respectively, from a logic high value to a logic low value may be minimized.

Figure 5:
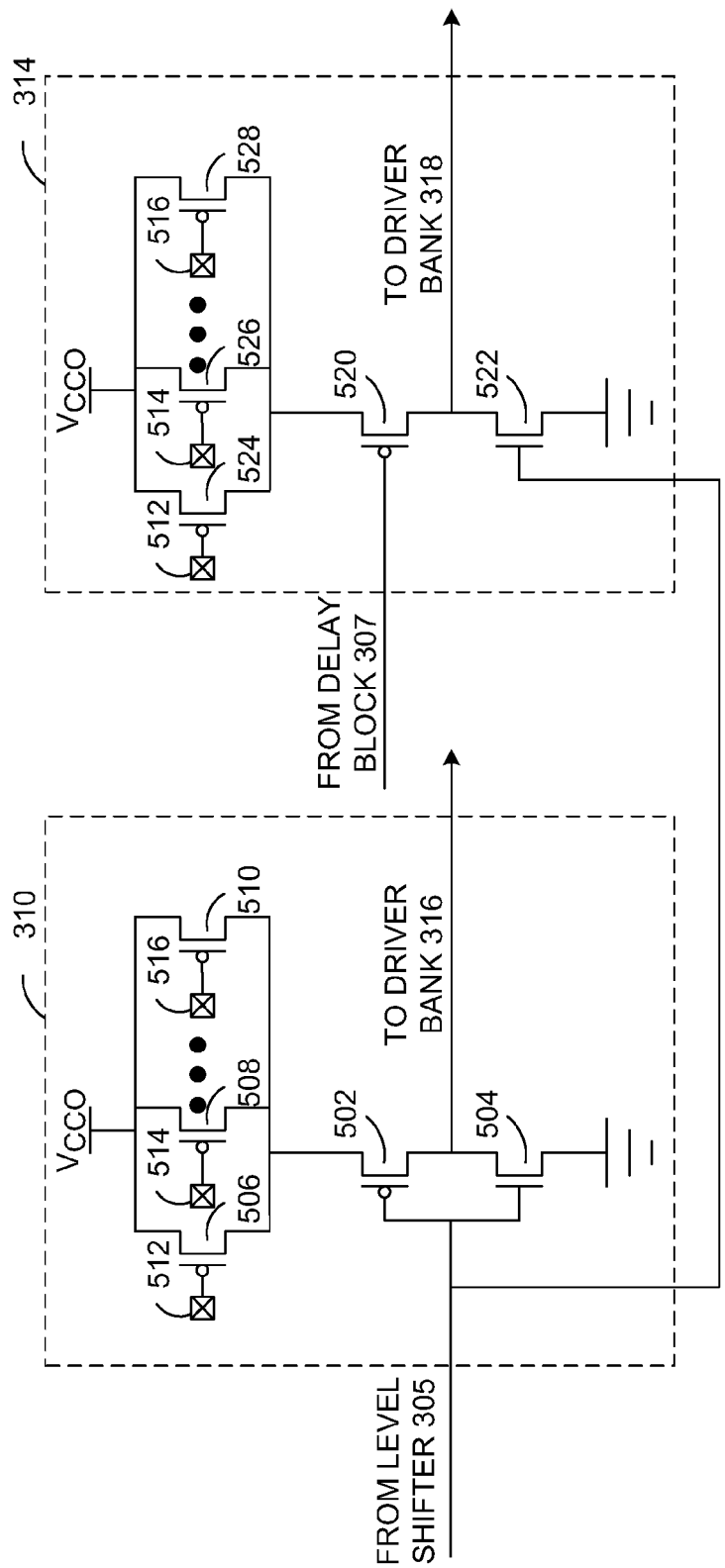
FIG. 5 illustrates schematic diagrams of modeled pre-drivers contained within the buffer of FIG. 3 in accordance with various alternate embodiments of the present invention.

Turning to FIG. 5, schematic diagrams relating to modeled pre-driver N 310 and pre-driver N 314 for data path A of FIG. 3 are illustrated. It is understood that pre-driver N 360 and pre-driver N 364 for data path X, as well as the pre-driver Ns (not shown) for the other data paths of FIG. 3, may be identical to pre-driver N 310 and pre-driver N 314 as illustrated in FIG. 5. In operation, pre-driver N 310 and pre-driver N 314 may be modeled as inverters, whereby PMOS transistors 502,520 and NMOS transistors 504,522 are coupled as shown to provide inverting operations.

Logic values for control lines 512-516 are received from slew rate control 232 of FIG. 2. Thus, one or more of PMOS transistors 506-510 and 524-528 may be made conductive depending upon the logic values of control lines 512-516. In one embodiment, the geometries of transistors 506-510 may vary, such that the magnitude of source-drain current, $I_{DS}$, provided by transistor 506 is twice the magnitude of $I_{DS}$ provided by transistor 508. Similarly, the magnitude of $I_{DS}$ provided by transistor 508 is twice the magnitude of $I_{DS}$ provided by transistor 510. As such, the magnitude of current conducted through transistor 502 may be programmed in a binary fashion through appropriate selection of the conductive states of transistors 506-510. The geometries of transistors 524-528 are similarly weighted, so that the magnitude of current conducted through transistor 520 may be similarly programmed in a binary fashion. Accordingly, the slew rate of the outputs of pre-driver N 310 and pre-driver N 314 may be programmably modeled.

If a slow slew-rate is required by the modeled I/O standard, for example, then perhaps only a single transistor, e.g., transistors 510 and 528, may be rendered conductive by values of control lines 512-516 as provided by slew rate control 232. In such an instance, the time required to slew the output of pre-driver N 310 and pre-driver N 314, respectively, from a logic low value to a logic high value may be maximized. If a fast slew-rate is required by the modeled I/O standard, on the other hand, then perhaps all transistors, e.g., transistors 506-510 and 524-528, may be rendered conductive by configuration memory values 512-516 as provided by slew rate control 232. In such an instance, the time required to slew the output of pre-driver N 310 and pre-driver N 314, respectively, from a logic low value to a logic high value may be minimized.

It can be seen, therefore, that by generating the appropriate HSPICE simulation setup file within S2I converter 126 and selecting the appropriate control lines values via slew rate control 232 of configuration data files 124, appropriate pre-driver models for pre-drivers 308-314 and 358-364 may be generated. That is to say, in other words, that depending upon the particular rise-time and fall-time values that are required by a particular I/O standard, the appropriate simulation setup file may be generated by S2I converter 126 in response to slew rate control 232 of configuration data files 124. In addition, the appropriate $V_{OH}$, $V_{OL}$, and associated $I_{OH}$, $I_{OL}$, values may be obtained through similar modeling of driver banks 316-318 and 366-368.

Figure 6:
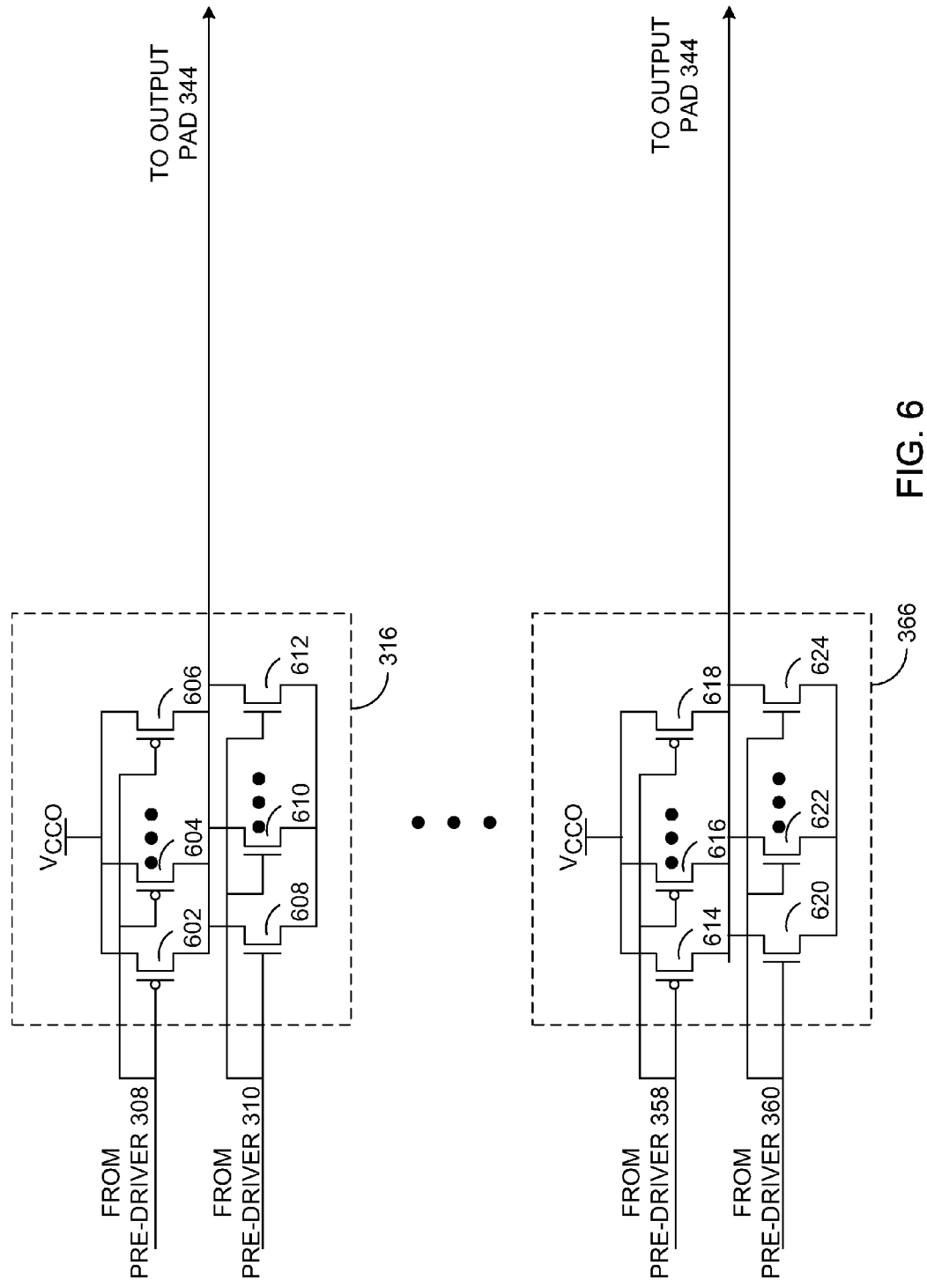
FIG. 6 illustrates schematic diagrams of the modeled driver banks of FIG. 3 in accordance with various embodiments of the present invention.

Turning to FIG. 6, for example, a schematic diagram that represents driver banks 316 and 366 is illustrated. It is understood that driver banks 318 and 368 for delayed data paths A and X, as well as the driver banks (not shown for simplicity) for the other data paths of FIG. 3 may be identical to driver banks 316 and 366 as illustrated in FIG. 6, except that the number of NMOS and PMOS transistors utilized for each leg of each driver bank may be different from one driver bank to another. As discussed above in relation to FIG. 3, each driver bank may either be independently modeled via AND gates 302/303, 352/353 and multiplexers 320/321, 370/371 to operate as programmable current drivers, or each driver bank may be independently modeled via AND gates 302/303, 352/353 and multiplexers 320/321, 370/371 as digitally controlled impedance devices.

For example, driver bank 316 may be modeled as a bank of PMOS transistors 602-606 that provides a predetermined amount of $I_{OH}$ at output pad 344 for non-delayed data path A and a bank of NMOS transistors 608-612 that provides a pre-determined amount of $I_{OL}$ at output pad 344 for non-delayed data path A. Conversely, driver bank 316 may be modeled as a bank of PMOS transistors 602-606 that provides a predetermined amount of pull-up resistance at output pad 344 for non-delayed data path A and a bank of NMOS transistors 608-612 that provides a pre-determined amount of pull-down resistance at output pad 344 for non-delayed data path A.

Similarly, driver bank 366 may be modeled as a bank of PMOS transistors 614-618 that provides a predetermined amount of $I_{OH}$ at output pad 344 for non-delayed data path X and a bank of NMOS transistors 620-624 that provides a predetermined amount of $I_{OL}$ at output pad 344 for non-delayed data path X. Conversely, driver bank 366 may be modeled as a bank of PMOS transistors 614-618 that provides a predetermined amount of pull-up resistance at output pad 344 for non-delayed data path X and a bank of NMOS transistors 620-624 that provides a pre-determined amount of pull-down resistance at output pad 344 for non-delayed data path X.

In an example, the number of NMOS transistors contained within driver bank 316 may be different, e.g., greater, than the number of NMOS transistors contained within driver bank 366. In addition, the number of PMOS transistors contained within driver bank 316 may be different, e.g., greater, than the number of PMOS transistors contained within driver bank 366. In such an instance, the magnitude of $I_{OH}$ and $I_{OL}$ as provided by driver bank 316 may be different, e.g., greater, than the magnitude of $I_{OH}$ and $I_{OL}$ as provided by driver bank 366. Conversely, the magnitude of pull-up and pull-down resistance as provided by driver bank 316 may be different, e.g., less, than the magnitude of pull-up and pull-down resistance as provided by driver bank 366. The numbers of PMOS and NMOS transistors contained within the other driver banks (not shown) of FIG. 6 may be similarly apportioned, such that a monotonic, binary, or other programmable output current drive/impedance magnitude may be applied to output pad 344 depending upon the number of driver banks that are enabled for output current drive and the number of driver banks that are enabled for impedance control.

Once the HSPICE simulation setup files representing the block diagram of FIG. 2 have been generated, HSPICE simulator 128 of FIG. 1 may be utilized to simulate the V/T and V/I values, which characterize the pull-up and pull-down signal values over time that are exhibited by the modeled I/O buffer. The pull-up values of the modeled I/O buffer, for example, describe the V/I behavior when the voltage magnitude at output pad 210 slews from a logic low value to a logic high value. Pull-down values of the modeled I/O buffer, on the other hand, describe the V/I behavior when the voltage magnitude at output pad 210 slews from a logic high value to a logic low value. Thus, the logic transitions of signal DATA at the input of control block 212 should be simulated by HSPICE simulator 128 with a sufficient frequency so as to generate V/T values at output pad 210 that adequately describe the slew performance of the modeled I/O buffer.

Figure 7:
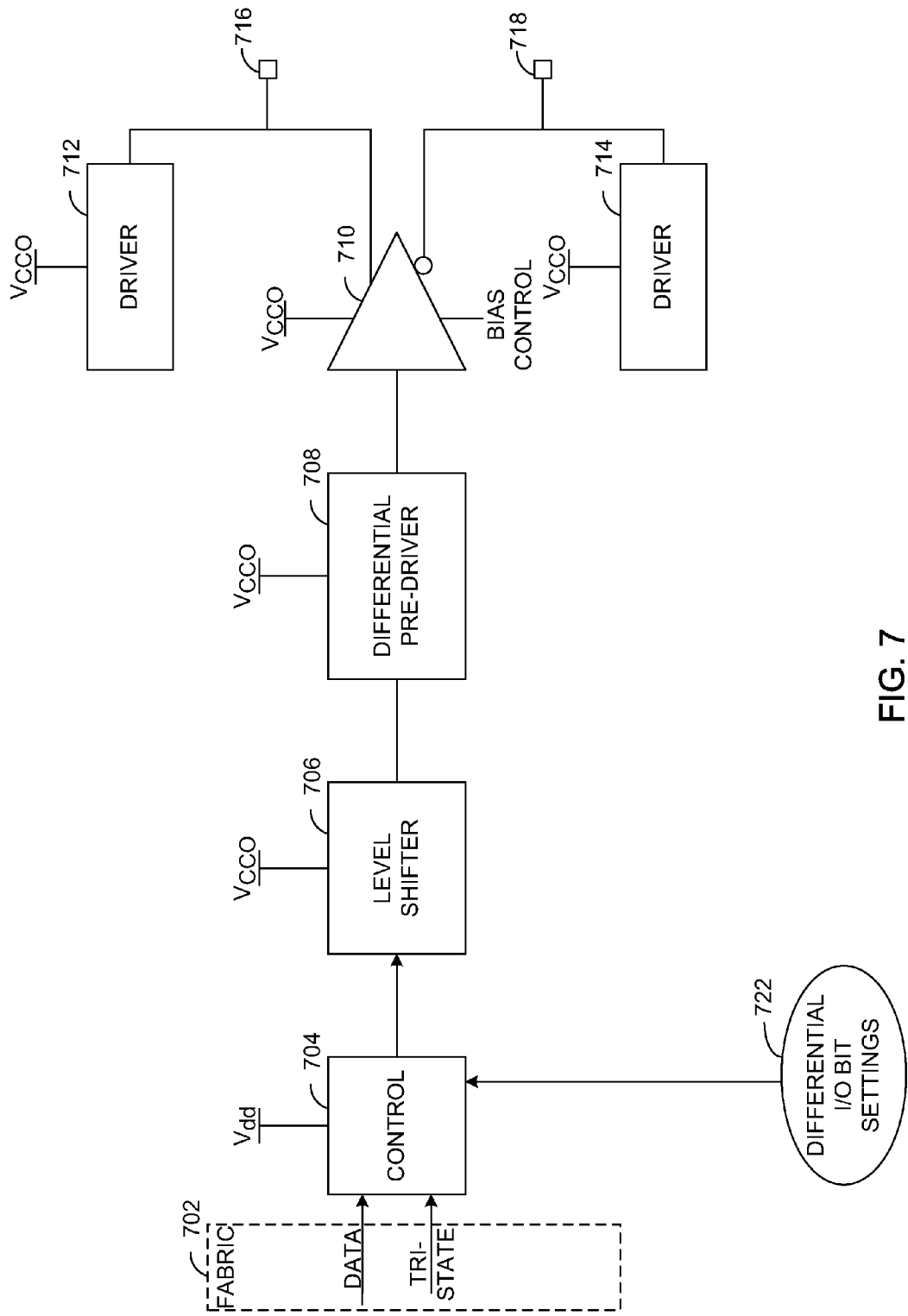
FIG. 7 illustrates a schematic diagram of components contained within an input/output buffer information specification (IBIS) model for a differential I/O buffer in accordance with an embodiment of the present invention.

Turning to FIG. 7, a block diagram of a differential I/O buffer is illustrated, whereby differential I/O standards, such as low-voltage differential signaling (LVDS), LVDS extended, and hypertransport protocol (HT) may be similarly modeled by the automated IBIS model generator. Drivers 712 and 714 may be identical to output buffer 204 of FIG. 2, whereby in operation, drivers 712 and 714 may be tri-stated, so as to allow differential amplifier 710 to drive output pads 716 and 718. The operation of control block 704, level shifter 706, and differential pre-driver 708 are substantially equivalent to the operation of control block 212, level shifter 214, and pre-driver 216 as discussed above in relation to FIG. 2. Differential amplifier 710 may be similarly modeled using configuration data files 124 to provide the output signal parameters, e.g., voltage out high ($V_{OH}$), voltage out low ($V_{OL}$), duty cycle, rise time, and fall time, as may be required by the particular differential I/O standard being modeled.

Figure 8:
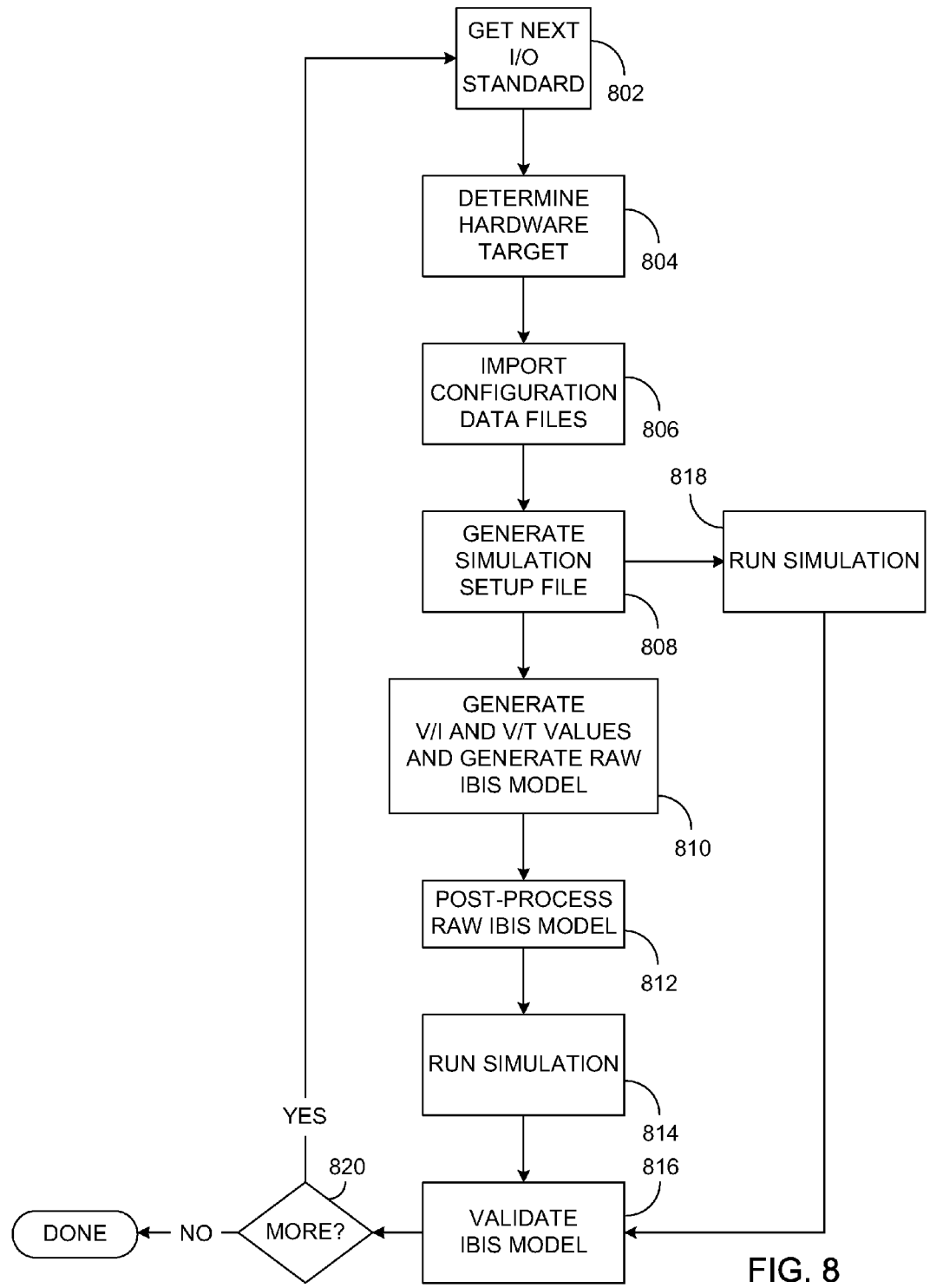
FIG. 8 illustrates an automated IBIS model generation flow in accordance with one embodiment of the present invention.

Turning to FIG. 8, an automated IBIS model generation flow is illustrated that may be executed by the simulation platform as illustrated in FIG. 1, whereby the automated IBIS model generator may exist as a wrapper utility that combines each component required IBIS model generation into an automated generation flow. The wrapper utility begins execution in step 802 with a determination as to which I/O standard is to be modeled. Next, the hardware target must be determined as in step 804. Given that a programmable logic device (PLD) is the hardware target that is to be modeled, for example, a plurality of configuration files 124, as discussed above in relation to FIG. 1, may be imported by the automated IBIS model generator, as in step 806, so as to properly configure the modeled I/O buffers within the PLD for a given I/O standard. A field programmable gate array (FPGA), for example, is representative of a PLD that contains configurable I/O drivers and receivers that may support hundreds of I/O standards.

Each I/O standard defines a specific set of signal parameters, such as output drive voltage magnitude, e.g., $V_{OH}$, that may be set in accordance with the modeled parameters of drivers 218 and 710, as defined by configuration data files 124, and as discussed above in relation to FIGS. 2, 3, 6, and 7. Slew rate parameters defined by slew rate control 232 may also be modeled within pre-driver 216 as discussed above in relation to FIGS. 2, 4, and 5. Output drive strength, i.e., magnitude of the output drive current, as defined by single-ended I/O bit settings 230 and differential I/O bit settings 722 may also be modeled within drivers 218 and 710 as discussed above in relation to FIGS. 2, 3, 6, and 7. DCI bit settings 228 may also be imported into the automated IBIS model generator, so as to properly define the output and input termination impedance, as discussed above in relation to FIGS. 2, 3, and 6, if the modeled I/O standard requires on-die impedance control.

Once all of the configuration data files that define the I/O buffer model for a particular I/O standard have been imported by the automated IBIS model generator, an HSPICE simulation setup file may be generated in step 808 that corresponds to the configuration data files. Next, an HSPICE simulation is executed by HSPICE simulator 128 in step 810 that is based upon the HSPICE simulation setup file generated in step 808 to determine the voltage/current (V/I) and voltage/time (V/T) data for the modeled I/O buffer for each process corner. Next, the raw IBIS model is generated in step 810 that corresponds to the simulated voltage/current (V/I) and voltage/time (V/T) data.

The raw IBIS model is an ASCII formatted text file, which may then be post-processed in step 812 to modify the structure of the IBIS model so that the IBIS model follows the format as specified by the IBIS standard. Once the first IBIS model is completed, an HSPICE simulation may be executed in step 814 using the post-processed IBIS model generated in step 812. In step 816, the accuracy of the IBIS model is then validated by correlating the simulation data generated in step 814 with the simulation data generated by the HSPICE simulation in step 818. That is to say, in other words, that the HSPICE simulation of step 818 may be performed using the HSPICE simulation setup file as generated in step 808, the results of which are then compared to the HSPICE simulation results performed using the IBIS model generated in step 812. A correlation report may then be generated in step 816 to illustrate the results of the comparison, whereby the percentage error deviation of the simulated results of step 814, as compared to the simulation results of step 818, may be verified. Execution steps 802-820 may then be iterated within an execution loop if more I/O standards are to be modeled as determined in step 820, so as to generate and correlate IBIS models for each I/O standard that is supported by the I/O buffers within the FPGA.

Thus, the plurality of IBIS models that may be automatically generated by the IBIS model generator correspond to the plurality of single-ended and differential I/O standards that may be supported by the I/O buffers contained within the integrated circuits (ICs) of the electronic system being simulated. Once the execution steps of FIG. 8 are completed, a single file containing all modeled I/O standards may be generated, which may then be released to electronic design automation (EDA) vendors for use on their simulation platforms that are compatible with IBIS models.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of automating input/output (I/O) buffer information specification model generation, the method comprising:
    importing configuration data files into an input/output buffer information specification model generator;
    wherein the configuration data files indicate a plurality of configurations of a configurable I/O buffer, and the plurality of configurations correspond to respective sets of signal parameter values;
    for each one of a plurality of I/O standards to be modeled, performing steps including:
        selecting data from one or more of the configuration data files to model the I/O buffer configured in compliance with one of the respective sets of signal parameter values indicated by the I/O standard;
        generating a simulation setup file for the modeled input/output buffer;
        executing an HSPICE simulation based on the simulation setup file of the modeled I/O buffer;
        measuring a first set of simulation results from the HSPICE simulation;
        generating an input/output buffer information specification model from the first set of simulation results measured;
        executing a second simulation based on the generated input/output buffer information specification model, the executing of the second simulation resulting in a second set of simulation results;
        comparing the first set of simulation results to the second set of simulation results; and
        outputting data indicating results of the comparison; and
    outputting each input/output buffer information specification model generated from each of the plurality of I/O standards.

2. The method of claim 1, wherein generating a simulation setup file comprises modeling a control block within the modeled buffer.

3. The method of claim 2, wherein the modeling of a control block comprises modeling logic gates configured to enable a plurality of data paths within the modeled buffer.

4. The method of claim 3, wherein
    the modeled logic gates are configured to set an output drive level of the modeled input/output buffer to an output drive level indicated by the corresponding set of signal parameters of the corresponding I/O standard; and the modeled logic gates are configured to set the output drive level by enabling a respective first set of data paths of the plurality of data paths within the modeled buffer.

5. The method of claim 4, wherein the setting of an output drive level of the modeled input/output buffer comprises activating one or more banks of transistors within each of the first set of data paths in response to the corresponding I/O standard indicating a required output drive level.

6. The method of claim 4, wherein the modeled logic gates are configured to set an output impedance level of the modeled input/output buffer by enabling a second set of data paths of the plurality of data paths.

7. The method of claim 6, wherein the setting of an output impedance level of the modeled input/output buffer comprises activating one or more banks of transistors within each of the second set of data paths in response to the corresponding I/O standard indicating a required output impedance level.

8. The method of claim 2, wherein generating a simulation setup file for the modeled buffer further comprises modeling a pre-driver block within the modeled buffer.

9. The method of claim 8, wherein modeling a pre-driver block comprises activating one or more transistors within the pre-driver block in response to the corresponding I/O standard indicating a required slew rate.

10. A system for generating a plurality of input/output (I/O) buffer information specification models, comprising:
a processor adapted for performing functions including:
importing configuration data files that indicate a plurality of configurations of a configurable I/O buffer, and the plurality of configurations correspond to respective sets of signal parameter values;
for each one of a plurality of I/O standards to be modeled, performing steps including:
modeling the input/output buffer using data selected from one or more of the configuration data files, the selected data corresponding to respective sets of signal parameter values indicated by the I/O standards;
generating a simulation setup file for the modeled I/O buffer;
executing an HSPICE simulation based on the simulation setup file of the modeled buffer;
measuring a first set of simulation results from the HSPICE simulation;
generating an input/output buffer information specification model from the first set of simulation results measured;
executing a second simulation based on the generated input/output buffer information specification model, the executing of the second simulation resulting in a second set of simulation results;
comparing the first set of simulation results to the second set of simulation results; and
outputting data indicating results of the comparison
combining all of the input/output buffer information specification models into a single executable file.

11. The input/output buffer information specification modeling system of claim 10, wherein generating a simulation setup file for the modeled buffer comprises modeling a respective control block within the modeled buffer.

12. The input/output buffer information specification modeling system of claim 11, wherein the modeling a respective control block comprises modeling logic gates that are-configured to enable a plurality of data paths within the modeled buffer.

13. The input/output buffer information specification modeling system of claim 12, wherein the modeled logic gates are configured to set an output drive level of the modeled buffer by enabling a first set of data paths of the corresponding plurality of data paths.

14. The input/output buffer information specification modeling system of claim 13, wherein the setting of an output drive level of the modeled buffer comprises activating one or more banks of transistors within each of the first set of data paths in response to a required output drive level.

15. The input/output buffer information specification modeling system of claim 14, wherein the modeled logic gates are further configured to set an output impedance level of the modeled buffer by enabling a second set of data paths of the corresponding plurality of data paths.

16. The input/output buffer information specification modeling system of claim 15, wherein the setting of an output impedance level of the modeled buffer comprises activating one or more banks of transistors within each corresponding second set of data paths in response to a required output impedance level.

17. The input/output buffer information specification modeling system of claim 11, wherein generating a simulation setup file for the modeled buffer further includes modeling a pre-driver block within each of the plurality of buffers.

18. The input/output buffer information specification modeling system of claim 17, wherein the pre-driver block is configured to activate one or more transistors within the pre-driver block in response to a required slew rate.

19. A method of combining a plurality of input/output buffer information specification models into a file, the method comprising:
for each of a plurality of input/output standards to be modeled:
determining hardware for implementing the input/output standard;
importing configuration data files for the hardware;
generating a simulation setup file including a model input/output buffer configured in compliance with signal parameters indicated by the input/output standard;
executing an HSPICE simulation based on the simulation setup file to determine a first set of performance characteristics for one or more process corners; and
generating an input/output buffer information specification model from the first set of performance characteristics;
executing a second simulation based on the generated input/output buffer information specification model, the executing of the second simulation resulting in a second set of performance characteristics;
comparing the first set of performance characteristics to the second set of performance characteristics; and
outputting data indicating results of the comparison; and
storing each generated input/output buffer information specification model into the file.

20. The method of claim 19, further comprising
verifying a percentage error deviation between results obtained from the first and second simulations.

* * * * *